(12) United States Patent
Endoh et al.

(10) Patent No.: US 12,453,049 B2
(45) Date of Patent: Oct. 21, 2025

(54) LOOP HEAT PIPE, COOLING SYSTEM, ELECTRONIC EQUIPMENT, AND WICK

(71) Applicants: Takeshi Endoh, Kanagawa (JP); Tomoyasu Hirasawa, Kanagawa (JP)

(72) Inventors: Takeshi Endoh, Kanagawa (JP); Tomoyasu Hirasawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 345 days.

(21) Appl. No.: 17/685,409

(22) Filed: Mar. 3, 2022

(65) Prior Publication Data
US 2022/0295670 A1   Sep. 15, 2022

(30) Foreign Application Priority Data

Mar. 12, 2021   (JP) .............................. 2021-040456

(51) Int. Cl.
*H05K 7/20*   (2006.01)

(52) U.S. Cl.
CPC ..... *H05K 7/20336* (2013.01); *H05K 7/20309* (2013.01); *H05K 7/20318* (2013.01)

(58) Field of Classification Search
None
See application file for complete search history.

(56) References Cited

U.S. PATENT DOCUMENTS 10,527,359 B1 *  1/2020  Roper ................ H05K 7/20336
11,535,360 B1 * 12/2022  Roper .................... F28F 13/18
2018/0180360 A1 *  6/2018  Katoh .................... H01L 23/427
2019/0390918 A1   12/2019  Hirasawa et al.
2020/0033068 A1 *  1/2020  Endoh ................ H05K 7/20336
2020/0281095 A1 *  9/2020  Rush ..................... B22F 3/1103
2020/0386489 A1   12/2020  Baba et al.

FOREIGN PATENT DOCUMENTS

| JP | 2018109497 A | 7/2018 |
|---|---|---|
| JP | 2020-020495 | 2/2020 |
| JP | 2020-200977 | 12/2020 |
| JP | 2021006753 A | 1/2021 |
| JP | 2021-148418 | 9/2021 |
| JP | 2022-020243 | 2/2022 |
| JP | 2022-021057 | 2/2022 |

OTHER PUBLICATIONS

Notice of Rejection of Japanese Patent Application No. JP2021040456 issued Sep. 10, 2024 (8 pages; with English translation).

\* cited by examiner

*Primary Examiner* — Courtney L Smith
(74) *Attorney, Agent, or Firm* — XSENSUS LLP

(57) ABSTRACT

Disclosed is a loop heat pipe having an evaporator, a condenser, a vapor line connected between the evaporator and the condenser through which a vapor-phase working fluid flows, a liquid line connected between the condenser and the evaporator through which a liquid-phase working fluid flows, and a wick having an elasticity and provided inside the evaporator in a compressed and deformed state. The liquid-phase working fluid permeates into the wick, and a boundary between the liquid phase working fluid and the vapor phase working fluid is formed in the wick. A stress generated in the wick due to compressive deformation is greater than a pressure loss that occurs during circulation of the working fluid from the vapor-phase side of the boundary via the condenser back to the liquid-phase side of the boundary.

13 Claims, 9 Drawing Sheets

FIG.8A

|  |  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| wick | material | silicone rubber formulation A | silicone rubber formulation B | silicone rubber formulation A | silicone rubber formulation C | silicone rubber formulation A | silicone rubber formulation A | polyethylene | sintered metal |
|  | elastic modulus E [Pa] | 90000 | 90000 | 90000 | 5000 | 90000 | 90000 | 11000 | 2.00E+11 |
|  | porosity [%] | 70 | 70 | 70 | 70 | 70 | 70 | 60 | 60 |
|  | maximum diameter of open-cell pore [μm] | 5 | 20 | 5 | 5 | 5 | 5 | 20 | 5 |
|  | contact angle [°] | 30 | 30 | 30 | 30 | 30 | 30 | 30 | 60 |
|  | thickness [mm] | 2 | 2 | 2 | 2 | 2 | 2 | 2 | 2 |
|  | strain ε (compression rate) [%] | 15 | 15 | 20 | 15 | 5 | 30 | 15 | 5 |
|  | compressive deformation stress σ [Pa] | 13,500 | 13,500 | 18,000 | 750 | 4,500 | — | 1,650 | 1.00E+10 |
|  | elastically deformable maximum stress σmax [Pa] | 22,500 | 22,500 | 22,500 | 1,250 | 22,500 | 22,500 | — | — |

FIG.8B

| | | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| working fluid | | water | water | water | water | water | water | water | water |
| case | material | | | | | | | | |
| | thickness [mm] | 2 | 2 | 2 | 2 | 2 | 2 | 2 | 2 |
| performance | system pressure loss ΔPtotal [Pa] | 10,000 | 9,500 | 10,000 | 10,000 | 10,000 | 10,000 | 10,500 | 13,000 |
| | capillary force Pcap [Pa] | 45,700 | 11,400 | 45,700 | 45,700 | 45,700 | 45,700 | 11,400 | 26,000 |
| evaluation | cooling performance | ○ | ○ | ○ | × | × | × | × | × |
| | contact state | ○ | ○ | ○ | ○ | × | ○ | ○ | × |
| | deformation | ○ | ○ | ○ | ○ | ○ | × | ○ | × |

LOOP HEAT PIPE, COOLING SYSTEM, ELECTRONIC EQUIPMENT, AND WICK

CROSS-REFERENCE TO RELATED APPLICATIONS

This application is based upon and claims priority to earlier Japanese Patent Application No. 2021-040456 filed Mar. 12, 2021, which is incorporated herein by reference in its entirety.

TECHNICAL FIELD

The present disclosure relates to a loop heat pipe, a cooling system using a loop heat pipe, electronic equipment, and a wick used in a loop heat pipe.

BACKGROUND

Conventionally, a loop heat pipe, which has an evaporator that changes the phase of the working fluid from the liquid phase to the vapor phase and a condenser that changes the phase of the working fluid from the vapor phase to the liquid phase, is known.

Japanese Patent Application Laid-open Publication No. 2020-20495 discloses a loop heat pipe having an elastic porous wick inside the evaporator. The wick accommodated in the evaporator is configured such that size of the foam or bubbles formed in the porous body is within a specific range.

For the loop heat pipe described in the above-noted Patent Document, there is room for improvement in the cooling performance.

SUMMARY

According to an embodiment, a loop heat pipe includes an evaporator that changes the phase of a working fluid from the liquid phase to the vapor phase, a condenser that changes the phase of the working fluid from the vapor phase to the liquid phase, a vapor line connected between the evaporator and the condenser through which the vapor-phase working fluid flows, a liquid line connected between the condenser and the evaporator through which the liquid-phase working fluid flows, and a wick having an elasticity and provided inside the evaporator in a compressed and deformed state, the liquid-phase working fluid permeating into the wick and forming a boundary between the liquid phase working fluid and the vapor phase working fluid in the wick. The stress generated in the wick due to compressive deformation is greater than a pressure loss that occurs during circulation of the working fluid from the vapor-phase side of the boundary via the condenser back to the liquid-phase side of the boundary.

BRIEF DESCRIPTION OF THE DRAWINGS

FIG. 8A illustrates various factors of samples according to examples and comparative examples prepared for cooling performance test;

FIG. 8B illustrates factors and evaluation results of the samples according to the examples and the comparative examples prepared for the cooling performance test.

DETAILED DESCRIPTION

Figure 1:
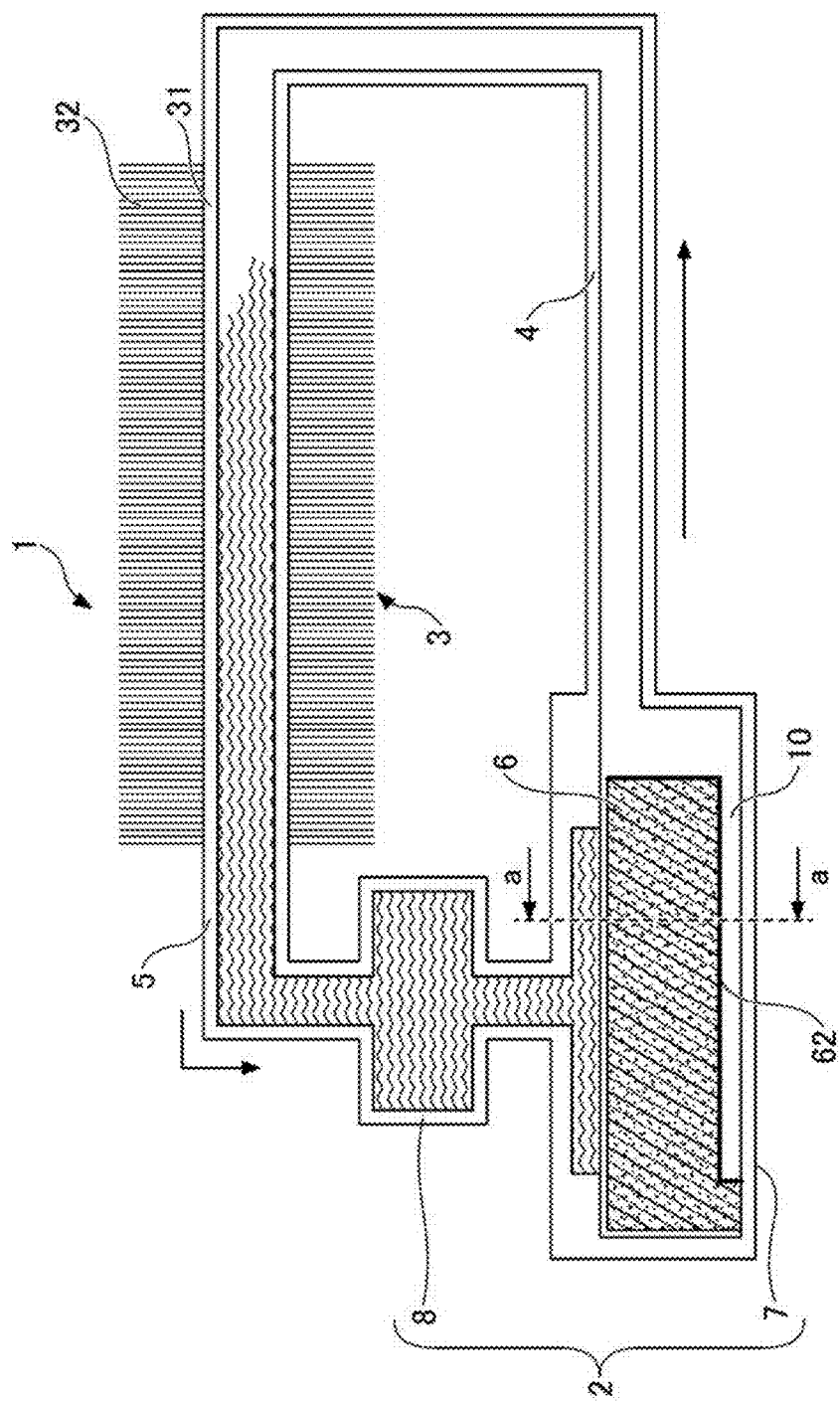
FIG. 1 is a schematic diagram of a loop heat pipe according to an embodiment.

A loop heat pipe and its application to a cooling system of electronic equipment are described in detail below. In the loop heat pipe according to an embodiment, an elastic wick is provided inside the evaporator in a compressed and deformed state.

In the appended figures illustrating the embodiments, those components or structural elements having the same configuration or function are denoted by the same reference numerals as long as the similarity is perceivable. Once explanation is made to a certain component or structural element, redundant explanation for the components indicated by the same reference numeral may be omitted as appropriate.

Figure 2:
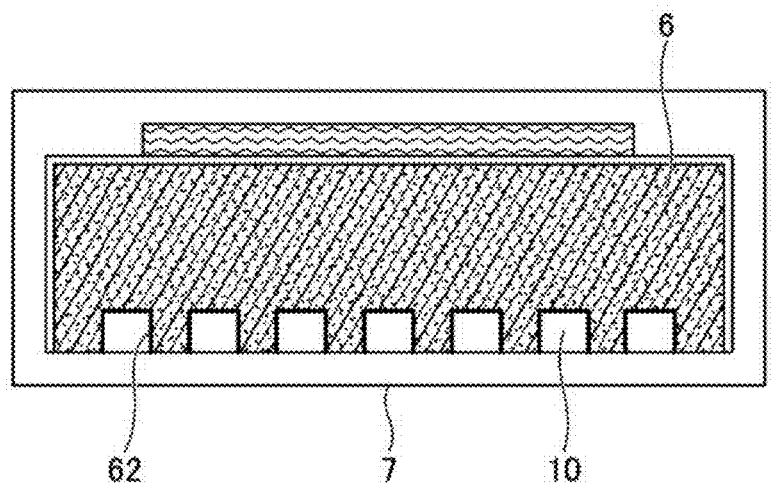
FIG. 2 is a virtual cross-sectional view taken along the a-a cross section indicated by the dashed line in FIG. 1.

FIG. 1 is a schematic diagram illustrating a configuration of a loop heat pipe of the present disclosure. FIG. 2 is a virtual cross-sectional view taken along the a-a cross section indicated by the dashed line of FIG. 1.

The loop heat pipe 1 shown in FIG. 1 has an evaporator 2 and a condenser 3. A working fluid, which is a condensable fluid, is sealed inside the loop heat pipe 1. The evaporator 2 absorbs heat from a heat source, and vaporizes the working fluid, causing the working fluid to change from the liquid phase to the vapor phase. The condenser 3 condenses the vapor-phase working fluid supplied from the evaporator 2 into the liquid phase. A vapor line 4 is provided to feed the vapor-phase working fluid from the evaporator 2 to the condenser 3, and a liquid line 5 is provided to supply the liquid-phase working fluid from the condenser 3 back to the evaporator 2.

The evaporator 2 includes a heat receiver 7 in which the wick 6 is accommodated, and a reservoir 8 for storing the liquid-phase working fluid supplied from the condenser 3. One end of the vapor line 4 is connected to the heat receiver 7, and one end of the liquid line 5 is connected to the reservoir 8. The other end of the vapor line 4 and the other end of the liquid line 5 are connected to the condenser 3. The condenser 3 is formed as a stainless steel pipe 31 having a large number of fins 32 provided on the outer surface of the pipe. The fins 32 are formed of, for example, aluminum thin plates, and serve as a heat sink.

The wick 6 has an elastic porous body made of a porous material. The liquid-phase working fluid permeates into the wick 6 from the reservoir 8, making use of the capillary action. Owing to the capillary phenomenon, the wick 6 serves as a pump that causes the liquid-phase working fluid to be supplied from the condenser 3 to the evaporator 2.

A plurality of grooves 10 are formed in the bottom surface (or the lower surface in FIG. 1 and FIG. 2) of the wick 6 in the heat receiver 7, the grooves 10 extend from one end of the wick 6 positioned near the vapor line 4 toward the opposite end of the wick 6. The grooves 10 may be provided at equal intervals at the bottom of the wick 6, as illustrated in the cross sectional view of FIG. 2. For the purpose of better understanding of the structure, the grooves 10 are illustrated in FIG. 2 such that the dimensional ratio to the wick 6 is greater than the actual configuration.

The wick 6 is porous, and at the same time, elastic. The thickness of the wick 6 is designed so as to be slightly greater than the inner height of the case of the heat receiver 7 of the evaporator 2. With such a design of the wick 6, when the wick 6 is inserted in the heat receiver 7, the wick 6 compressively deforms and comes into close contact with the inner wall of the heat receiver 7 under certain stress, except for the area in which the grooves 10 are formed. In the grooved area, spaces are formed between the wick 6 and the inner wall of the case of the heat receiver 7. The wick 6 also comes into close contact with the inner surface of the heat receiver 7 at the reservoir 8 side under a certain stress due to the compressive deformation.

Figure 3:
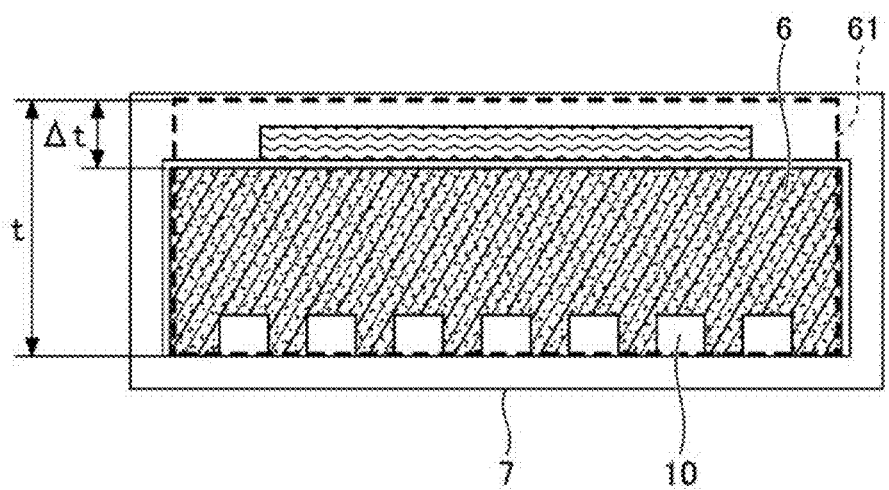
FIG. 3 is a diagram illustrating compressive deformation of a wick shown in FIG. 2.

The stress due to the compressive deformation of the wick 6 can be determined by the elastic modulus of the wick 6 and the strain generated when the wick 6 is accommodated in the heat receiver 7. In FIG. 3, the original shape 61 of the wick 6 before being accommodated in the heat receiver 7 is indicated by the dashed line in the cross-section of the heat receiver 7. The thickness of the wick 6 in the original shape 61 is t [mm]. Upon being accommodated in the heat receiver 7, the wick 6 is compressed in the thickness direction, and the thickness is reduced by Δt [mm] from the original size. The strain ε [%] due to the compressive deformation is expressed as ε=Δt/t×100. The stress σ [Pa] due to the compressive deformation in this state is expressed as σ=E×ε/100, using the bulk modulus E [Pa] and the strain ε [%].

Figure 4:
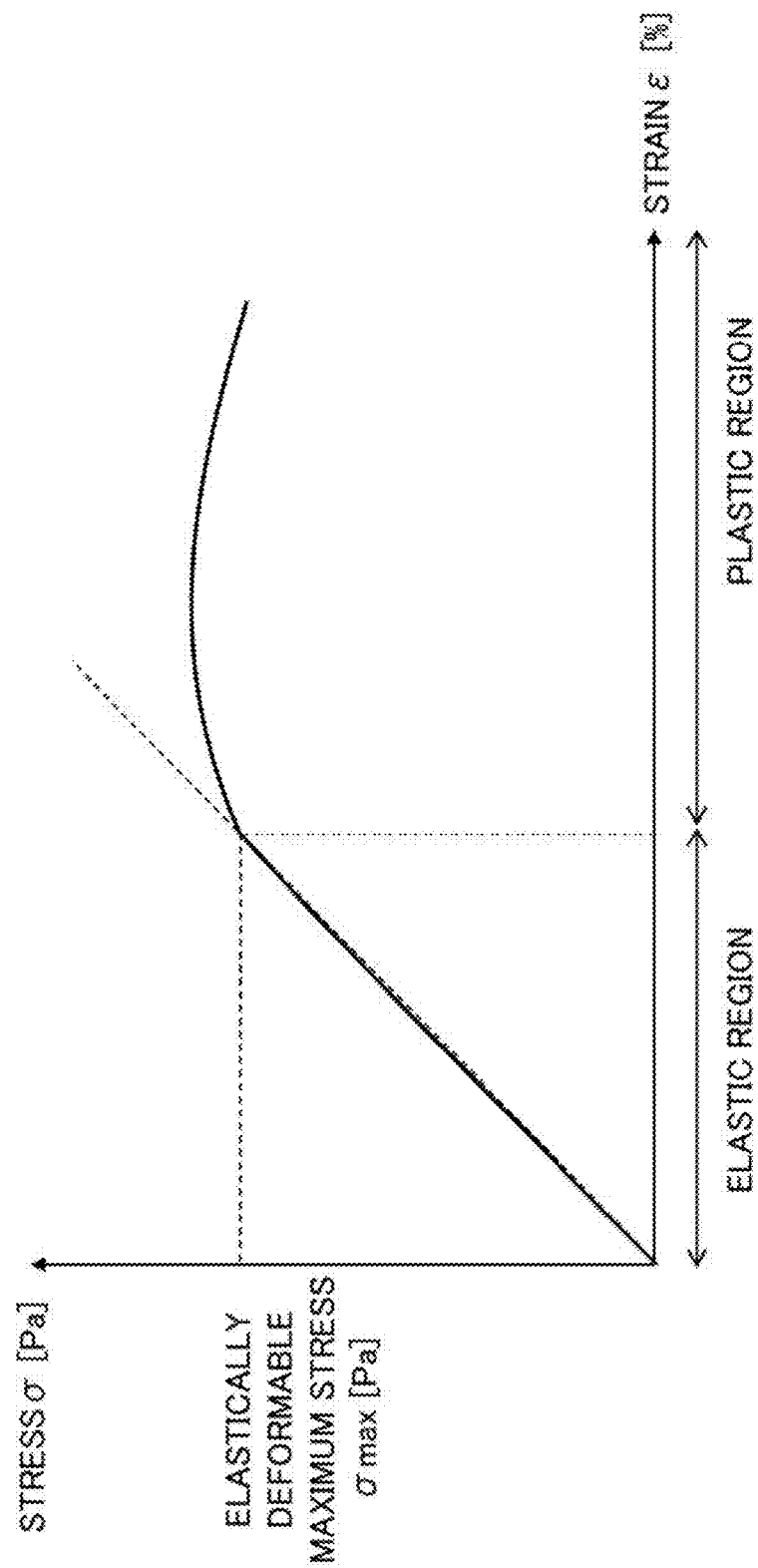
FIG. 4 is a schematic diagram showing the elastic region of the wick and the elastically deformable maximum stress.

The stress σ [Pa] due to the compressive deformation of the wick 6 is smaller than the elastically deformable maximum stress $\sigma_{max}$ of the wick 6 ($\sigma<\sigma_{max}$). FIG. 4 schematically shows the relationship between the strain ε [%] generated when the wick 6 is compressively deformed in the thickness direction and the stress σ [Pa] due to the compressive deformation. The stress σ [Pa] with respect to the strain ε is substantially linear within the range of elastically deformable strain. The range of elastically deformable strain is generally called an elastic region. Since the stress and strain of the compressive deformation of the wick 6 accommodated in the heat receiver 7 are within the elastic region, the wick 6 can be brought into close contact with the inner surface of the heat receiver 7 in a stable manner.

Meanwhile, in a region where the strain is greater than that of the elastically deformable region, the wick can plastically deform, and the relationship between the stress σ and the strain ε is non-linear. The range of such non-linear strain is generally called the plastic region. If the wick 6 is provided in the heat receiver 7 so as to be in the plastic region, namely, provided in such a state that the wick 6 is compressively deformed under the stress exceeding the elastically deformable maximum stress $\sigma_{max}$, the wick 6 will plastically deform and consequently lose the ability to be in close contact to the inner wall of the heat receiver 7 with appropriate stress.

By setting the stress due to compressive deformation of the wick 6 smaller than the elastically deformable maximum stress $\sigma_{max}$, the wick 6 can be maintained in close contact with the inner wall of the heat receiver 7 owing to the elastic deformation, even if the volume of the wick 6 or the internal dimensions of the heat receiver 7 change(s) due to a temperature change. Thus, the thermal contact between the heat receiver 7 and the wick 6 is maintained stable, and the loop heat pipe can operate in a stable manner.

(Working Fluid)

The working fluid is, for example, a condensable fluid such as water, alcohol, acetone, or hydrofluorocarbon (HFC) also known as alternative freon. In particular, water is preferably used as the working fluid because of its high latent heat of vaporization, achieving high cooling performance. It is also preferable for the working fluid to have good wettability with respect to the wick 6 so as to easily penetrate into the wick 6. Wettability can be measured by the contact angle between the wick 6 and the working fluid. If the contact angle is 40 [°] or more, the working fluid cannot penetrate through the wick 6, and accordingly, the contact angle is preferably less than 40 [°]. A contact angle of less than 10 [°] is more preferable because the capillary phenomenon is more effective.

(Operation of Loop Heat Pipe)

With the loop heat pipe 1 according to the embodiment, upon heat transfer from the heat source through the case of the evaporator 2 (or the heat receiver 7) to the liquid-phase working fluid in the wick 6, the working fluid evaporates absorbing the heat and changes its phase to the vapor phase. When the phase of the working fluid changes from the liquid phase to the vapor phase, the pressure of the vapor-phase working fluid increases in the grooves 10 according to the temperature of the working fluid. Due to the pressure increase, the working fluid having changed from the liquid phase to the vapor phase is sent to the vapor line 4 through the groove 10. Then, the vapor-phase working fluid is supplied to the condenser 3 through the vapor line 4.

In the condenser 3, the heat of the vapor-phase working fluid passing through the inside (i.e., the pipe 31) is released from the fins 32 to the outside, and the working fluid condenses into a liquid due to the decreasing temperature. The liquid-phase working fluid then flows through the liquid line 5 to the evaporator 2, and permeates again from the reservoir 8 into the wick 6 provided inside the heat receiver 7 based on the capillary phenomenon. By such circulation of the working fluid, the heat is continuously released from the heat source to the outside, and the cooling target is cooled.

When the working fluid transitions from the liquid phase to the vapor phase, the pressure of the vapor-phase working fluid increases inside the heat receiver 7. Owing to the pressure difference generated between the vapor-phase working fluid and the liquid-phase working fluid in the heat receiver 7, the working fluid flows from the groove 10 via the condenser 3 to the reservoir 8 in one direction. To allow the working fluid to flow in one direction, the wick 6 serves as a check valve for preventing the working fluid from flowing from the groove 10 back to the reservoir 8 without passing through the condenser 3.

(Boundary Between Liquid and Vapor Phases in Wick)

Because the wick 6 is made of a porous body, the liquid-phase working fluid stored in the reservoir 8 permeates into the wick 6, and a boundary 62 between the liquid phase and the vapor phase of the working fluid is created at the surface of or inside the wick 6. The boundary 62 is microscopically an interface between the liquid and the vapor phases formed with surface tension in the pores of the porous body. This interface is subjected to a capillary pressure $P_{cap}$ toward the vapor-phase side from the liquid-phase side. The capillary pressure $P_{cap}$ at the boundary 62 prevents the vapor-phase working fluid from flowing back to the wick 6.

The capillary pressure $P_{cap}$ at the boundary 62 of the wick 6 is expressed by formula (1), using the surface tension T of the liquid-phase working fluid, the contact angle θ of the liquid-phase working fluid with respect to the wick, and the pore radius $r_{wick}$ of the wick.

$$P_{cap}=2T \times \cos\theta/r_{wick} \quad (1)$$

The capillary pressure can be increased by increasing the wettability so that the contact angle of the working fluid with respect to the wick decreases, or by reducing the pore radius. Further, the capillary pressure can be controlled by adjusting the pore diameter of the wick 6. By setting the capillary pressure $P_{cap}$ greater than the pressure difference generated between the vapor phase and the liquid phase of the working fluid at the boundary 62, backflow of the working fluid from the vapor-phase side of the boundary 62 to the liquid-phase side of the boundary 62 can be prevented.

(System Pressure Loss)

The pressure difference generated at the boundary 62 between the liquid phase and the vapor phase corresponds to a system pressure loss $\Delta P_{total}$ caused during a single circulation of the working fluid from the vapor-phase side of the boundary 62 through the condenser 3 back to the liquid-phase side of the boundary 62.

Figure 5:
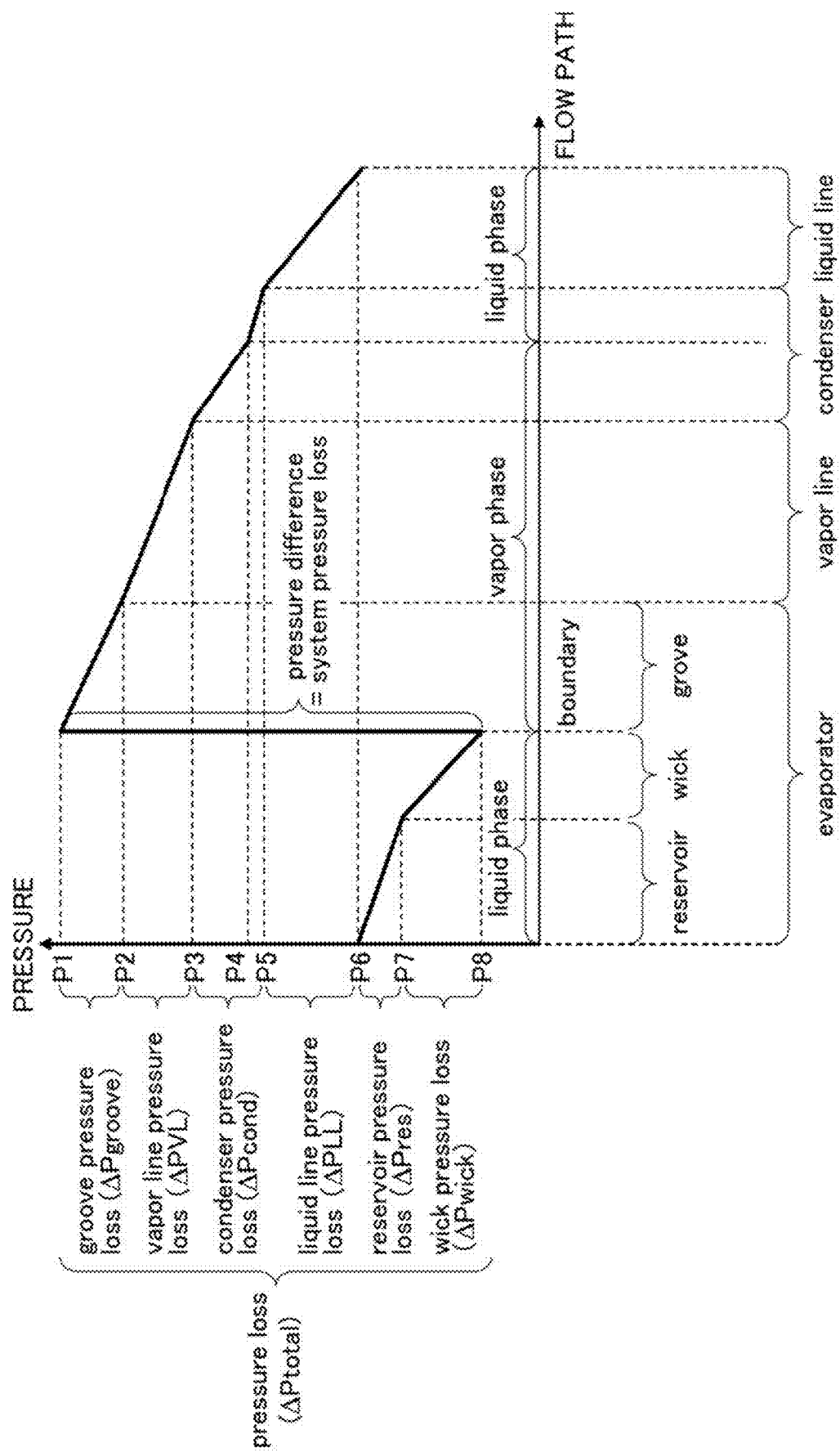
FIG. 5 is a diagram schematically illustrating a system pressure loss occurring in a loop heat pipe.

FIG. 5 schematically shows the pressure change in the working fluid through the flow path of the loop heat pipe. The horizontal axis represents flow path segment through which the working fluid flows from the left to the right along the axis. Because the flow path is configured in a loop, the right end of the liquid line along the horizontal axis of the figure is connected to the left end of the reservoir.

Pressure P1 on the vapor-phase side of the boundary 62 corresponds to a pressure generated by the change of the working fluid from the liquid phase to the vapor phase. The working fluid in the vapor-phase near the boundary flows through the grooves 10 toward the vapor line 4, a pressure loss ΔPgroove occurs in accordance with the flow rate of the working fluid and the fluid resistance in the grooves 10, and the pressure drops to P2. Then, the working fluid flows through the vapor line 4 toward the condenser 3, a pressure loss $\Delta P_{VL}$ occurs in accordance with the flow rate of the working fluid and the fluid resistance in the vapor line 4, and the pressure drops to P3. When the working fluid flows through the pipe 31 of the condenser 3 toward the liquid line 5, a pressure loss $\Delta P_{cond}$ occurs in accordance with the flow rate and fluid resistance in the condenser 3, and the pressure drops to P5. The pressure loss $\Delta P_{cond}$ is the sum of the pressure losses in the vapor phase and the liquid phase. The density of the working fluid in the liquid phase is smaller than the density of the vapor-phase working fluid, and accordingly, the flow rate of the liquid-phase working fluid is significantly smaller than that of the vapor-phase working fluid. Therefore, the pressure loss in the liquid phase is relatively small, compared with the pressure loss in the vapor phase.

The working fluid flows through the liquid line 5 toward the reservoir 8, generating a pressure loss $\Delta P_{LL}$, and the pressure drops to P6. The pressure loss $\Delta P_{LL}$ includes a pressure loss in accordance with the flow rate and fluid resistance of the working fluid, and a pressure loss due to gravity. The pressure loss due to gravity corresponds to a pressure difference due to the hydraulic head difference between the inlet port and outlet port of the liquid line. If the working fluid flows in the fluid line against gravity, $\Delta P_{LL}$ represents a positive amount of pressure loss due to the hydraulic head difference. If the working fluid flows in the liquid line along gravity, $\Delta P_{LL}$ represents a negative amount of pressure drop due to the hydraulic head difference. The hydraulic head difference can be determined based on the level difference between the liquid surface at the inlet port and the liquid surface at the outlet port of the liquid line, the density of the working fluid, and the gravitational constant. The working fluid further flows from the reservoir 8 toward the wick 6 in the evaporator 2, generating a pressure loss ΔPres in accordance with the flow rate of the working fluid, the fluid resistance in the reservoir and the hydraulic head difference, and the pressure drops to P7. The working fluid permeates into the wick 6 and moves in the wick 6 toward the boundary 62, generating a pressure loss $\Delta P_{wick}$ in accordance with the flow rate of the working fluid, as well as the fluid resistance and the hydraulic head difference in the wick, and the pressure drops to P8.

The system pressure loss $\Delta P_{total}$ generated by one round of the circulation of the working fluid corresponds to the sum of the pressure losses in the respective segments of the flow path, and is expressed by formula (2).

$$\Delta P_{total} = \Delta P_{groove} + \Delta P_{VL} + \Delta P_{cond} + \Delta P_{LL} + \Delta P_{res} + \Delta P_{wick} \quad (2)$$

The system pressure loss $\Delta P_{total}$ depends on both the quantity of heat processed by the loop heat pipe and the configuration of the loop heat pipe. It is known that the mass flow rate Lm [kg/s] of the working fluid required to process the heat quantity Q [W] at the loop heat pipe generally satisfies the following relationship.

$$Lm = Q/\eta \quad (3)$$

where η [J/kg] is the latent heat of vaporization of the working fluid. Formula (3) represents the relation that the greater the heat quantity Q to be processed, the greater the mass flow rate Lm of the working fluid.

The flow rate L [m³/s] of the working fluid can be calculated by L=Lm/ρ using the mass flow rate Lm [kg/s] and the density ρ [kg/m³] of the working fluid. The mass flow rate Lm is constant in the respective segments of the flow path of the loop heat pipe, but the flow rate L varies depending on whether the working fluid is in the liquid phase or the vapor phase. In the flow path segments through which the vapor-phase working fluid flows (i.e., the flow path including the grooves 10, the vapor line 4, and a part of the condenser 3), the density p of the working fluid is smaller than that of the liquid-phase working fluid, and thus the flow rate L is greater than that of the liquid-phase working fluid. On the other hand, in the flow path segments through which the vapor-phase working fluid flows (i.e., the flow path including a part of the condenser 3, the liquid line 5, the reservoir 8, and the wick 6), the density p of the working fluid is greater than that of the vapor-phase working fluid, and thus the flow rate L is smaller than that of the vapor-phase working fluid.

In general, the pressure loss ΔP caused by the working fluid flowing through the flow path satisfies the relationship of ΔP=Ra×L using the flow rate L of the working fluid and the fluid resistance Ra of the flow path. The fluid resistance of the flow path is determined by the physical properties of the working fluid (viscosity, etc.) and the dimensions of the flow path (cross-sectional area and length). The relationship among the pressure loss ΔP, the fluid resistance Ra, and the flow rate L depends on the magnitude of the flow rate, the temperature dependence of the working fluid viscosity, the material or the microscopic surface shape of the flow path, etc. Therefore, it is preferable to determine the pressure loss by actually measuring the pressure by supplying the practical working fluid to the flow path of the loop heat pipe at a flow rate actually used.

In this way, the fluid resistance is determined by the configuration of the loop heat pipe, while the flow rate L depends on the heat quantity Q processed by the loop heat pipe. Therefore, the pressure loss ΔP is determined by the quantity of heat to be processed by and the configuration of the loop heat pipe.

As has been described above, the flow rate of the vapor-phase working fluid is greater than the flow rate of the liquid-phase working fluid. Accordingly, the pressure loss according to the flow rate of the vapor-phase working fluid is ordinarily greater than the pressure loss according to the flow rate of the liquid-phase working fluid. The pressure loss due to the flow of the working fluid can be reduced by increasing the cross-sectional area of the flow path of the vapor-phase working fluid, by shortening the length of the flow path, etc. The flow path can be appropriately designed according to the size of the loop heat pipe, the layout of the flow path, or the like.

As the quantity of heat to be processed by the loop heat pipe increases, the pressure loss due to the fluid resistances in the respective components increase, and the total of the system pressure loss increases. The maximum of the system pressure loss $\Delta P_{total}$ is determined according to the maximum heat quantity Q to be processed by the loop heat pipe and the configuration and the layout of the flow path.

As shown in FIG. 5, the system pressure loss corresponds to the pressure difference between P1 and P8 (P8−P1) at the boundary 62 between the liquid-phase side and the vapor-phase side. In order to allow the working fluid to circulate in a certain direction without backflow, it is preferable for the boundary 62 to be configured to prevent backflow of the working fluid even if a pressure equal to the maximum system pressure loss $\Delta P_{total}$ (namely, the system pressure loss occurring when the maximum quantity of heat is processed) is applied. Two major factors that cause backflow of the vapor-phase working fluid at the boundary 62 and inside the heat receiver 7 are as follows.

The first factor is that the wick 6 is deformed by the pressure from the vapor-phase side of the boundary 62, and that a gap is created between the wick 6 and the inner surface of the heat receiver 7. In this case, the close contact between the wick 6 and the inner surface of the heat receiver 7 is lost, and thus the vapor-phase working fluid flows backward and leaks into the reservoir 8.

The second factor is that the boundary 62 itself cannot withstand the pressure from the vapor-phase side, and the vapor-phase working fluid flows toward the reservoir 8 through the wick 6.

A countermeasure against the first factor is to maintain the following relationship between the stress σ [Pa] due to compressive deformation occurring when the wick 6 is provided in the heat receiver 7 and the system pressure loss $\Delta P_{total}$ [Pa], expressed by formula (4).

$$\sigma \geq \Delta P_{total} \quad (4)$$

Here, $\Delta P_{total}$ is the system pressure loss caused when the maximum quantity of heat processable by the loop heat pipe is transferred. When the condition of formula (4) is satisfied, the wick 6 is compressed by a stress equal to or greater than the pressure applied from the phase-phase working fluid, and it does not deform any more even with the pressure from the vapor-phase working fluid. This configuration can prevent the vapor-phase working fluid from flowing back and leaking to the liquid-phase side of the boundary 62 due to further deformation. Even if a pressure is applied from the vapor-phase working fluid, the wick 6 is in close contact with the inner wall of the heat receiver 7 in a stable manner, and the thermal contact between the liquid-phase working fluid and the heat receiver can be stabilized. The grounds for this condition and verification results will be described later with reference to examples shown in FIG. 8A and FIG. 8B.

Further, the stress σ due to the compressive deformation of the wick 6 is set smaller than the elastically deformable maximum stress $\sigma_{max}$ of the wick ($\sigma < \sigma_{max}$). With this condition, close contact is maintained stably between the heat receiver 7 and the wick 6 owing to the elastic deformation of the wick 6, even if the dimensions of the heat receiver 7 or the wick 6 have changed due to the temperature change. As a result, stable operations of the loop heat pipe are achieved.

A countermeasure against the second factor is to keep the following relationship between the capillary pressure $P_{cap}$ [Pa] of the wick 6 and the system pressure loss $\Delta P_{total}$ [Pa], expressed by formula (6).

$$P_{cap} \geq \Delta P_{total} \quad (6)$$

Again, $\Delta P_{total}$ is the system pressure loss caused when the maximum quantity of heat processable by the loop heat pipe is transferred. By satisfying the relationship of formula (6), the boundary 62 can withstand the pressure from the vapor-side working fluid, and backflow of the vapor-phase working fluid through the wick 6 can be prevented.

It is desirable that the stress σ due to the compressive deformation of the wick 6 and the capillary pressure $P_{cap}$ satisfy the following relationship expressed by formula (7).

$$P_{cap} < \sigma \quad (7)$$

A situation where the loop heat pipe receives excessive quantity of heat over the processable level may occur due to abnormal operation of the equipment to be cooled, which results in excessively high system pressure loss. In such a case, backflow of the working fluid occurs due to either the first factor or the second factor. Formula (7) represents a condition that the backflow due to the second factor occurs prior to the backflow due to the first factor. Under this condition, the vapor-phase working fluid flows backward to the liquid-phase side at the boundary 62 of the wick 6 due to the second factor before the leakage of the vapor-phase working liquid into the reservoir 8 occurs due to the additional deformation of the wick 6 by the first factor. As a result, the wick 6 can be protected from unrecoverable damage or failure such as plastic deformation by allowing the backflow of the vapor-phase working fluid at the boundary and lowering the pressure by the wick 6 itself before the unrecoverable failure occurs.

For the countermeasures against the first factor and the second factor, a wick which is elastically deformable under a stress of compressive deformation and is capable of generating a high capillary pressure is effective. An example of such a wick 6 will be described in detail below.

The wick 6 used in the loop heat pipe 1 according to an embodiment is made of an elastic porous material such as a foamed silicone rubber. There are various methods of fabricating a wick formed of an elastic porous body. For example, the wick 6 may be formed of an elastic porous body fabricated using a technique of fabricating a water-foamed silicone rubber. Silicone rubber has high heat resistance and high chemical resistance. Accordingly, the temperature range of the loop heat pipe can be expanded, and deterioration due to the working fluid can be prevented.

In particular, a water-foamed silicone rubber composition is employed and stirred so that foam portions, which are spherical voids observed in a cross section obtained by cutting the final product of the foamed body, satisfy the following conditions. Namely, the foams existing in the cross section have a size ranging from 0.1 [μm] to 50 [μm], and the most frequently occurring size is 5 [μm] to 20 [μm].

More specifically, the above-described elastic porous body can be acquired by the following process. A catalyst, a surfactant, and a cross-linking agent are mixed into a commercially available two-component liquid silicone rubber to produce a liquid silicone rubber. Another mixed solution having a viscosity equivalent to that of the liquid silicone rubber is prepared by mixing an additive, a filler, a dispersant, or the like into water (or alcohol-added water if necessary). The liquid silicone rubber and the mixed solution are mixed and stirred to produce an emulsion composition. The specific gravity or the relative density of the liquid silicone rubber is preferably 1.00 to 1.05 [g/cm$^3$] in consideration of emulsifying property with water.

The blending ratio of the liquid silicone rubber and the mixed solution is adjusted depending on the target porosity. For example, if the blending ratio of the liquid silicone rubber and the mixed solution is 1:1, fine particles of water in the emulsion composition evaporate to form voids, and a foam having a pore ratio of 50 [%] can be obtained.

To acquire the emulsion, a homogenizer or a stirrer capable of ultrasonic treatment as necessary may be used. The stirring conditions such as the stirring manner, the stirring time, or the stirring speed (e.g., 300 to 1500 [rpm]) are adjusted so as to achieve the foam size distribution that satisfies the above-described ranges.

Then, the prepared emulsion composition is filled in a mold and heated to perform primary heating to cure the silicone rubber without evaporating the water content in the emulsion composition.

For example, the heating temperature is in the range of 80 to 130 [° C.], and the heating time is in the range of 30 to 120 minutes. Preferably, the heating temperature is 90 to 110 [° C.], and the heating time is 60 to 90 minutes. Next, secondary heating is performed to remove water from the foam acquired by the primary heating. The heating temperature of the secondary heating is 150 to 300 [° C.], and the heating time is in the range of 1 to 24 hours. Preferably, the heating temperature is 200 to 250 [° C.], and the heating time is 3 to 8 hours. By performing the secondary heating, moisture is removed from the elastic porous body, and composite foams, in which spherical foams partially overlap each other to form open-cell foam pores, are produced. Thus, the curing of the silicone rubber is finalized.

The surface of the finally cured material may be abraded by several microns to several millimeters, as necessary, by grinding with a grindstone or tape polishing for the purpose of improving the dimensional accuracy or removing the outermost skin layer. The grinded or polished material may be washed to remove the shavings or the impurities by ultrasonic cleaning or baking.

Furthermore, in order to impart hydrophilicity, hydrophilic treatment may be performed. Examples of the hydrophilic treatment include, but are not limited to treatments using corona, plasma, UV ozone, etc., and hydrophilic coatings. Alternatively, an additive that imparts hydrophilicity may be added in advance to the material. It is preferable to perform hydrophilic treatments performed so that hydrophilicity is imparted not only to the surface of the silicone rubber but also to the internal paths through which the working fluid passes. In particular, to achieve stable hydrophilicity over time, a combination of the hydrophilic coating and the hydrophilic treatment is preferable. For example, hydrophilic treatment using corona, plasma, UV ozone, etc. is performed to impart the hydrophilicity to the inside of the elastic porous material, and after that, hydrophilic coating is performed on the surface of the material.

Next, various factors (including the specifications and the manufacturing conditions) of the cross section obtained by cutting the water-foamed silicone rubber, which is the final product of the elastic porous body having been subjected to the final curing, will be described in more detail.

In order to achieve the stable operation of the loop heat pipe, it is preferable that the maximum diameter of the pores in the elastic porous body is maintained in a certain range so as to produce a greater capillary pressure. Specifically, the pore diameter of 50 [μm] or less is preferable. This is because if the maximum diameter of the pores is greater than 50 [μm], it is difficult to achieve a sufficient capillary pressure for driving the loop heat pipe. The maximum diameter of the pores is more preferably 30 [μm] or less, and yet further preferably, 10 [μm] or less.

(Diameter of Open-Cell Foam Pore)

Figure 6:
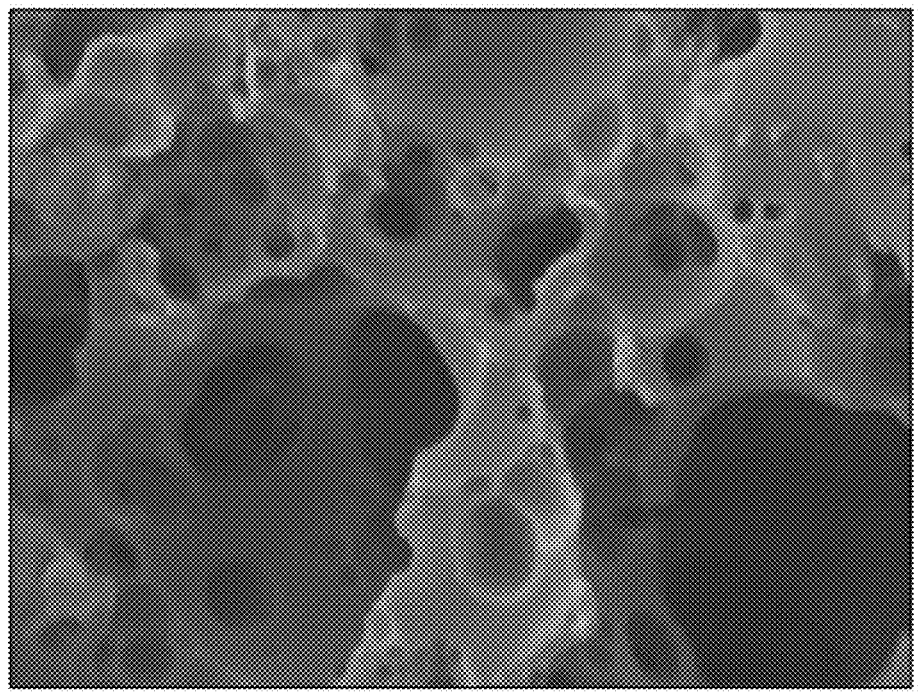
FIG. 6 is an image of open-cell foam pores formed in the wick of Example 1.

FIG. 6 is a microscope image of a cross section of the wick 6 obtained by cutting the wick 6. A plurality of pores overlapping and communicating with each other are observed. This type of pore with a plurality of interconnected pores is called an open-cell foam pore.

The elastic porous body used for the wick 6 has a function to feed the working fluid by the capillary pressure to drive the loop heat pipe 1. Accordingly, it is preferable for the open-cell foam pores of the elastic porous body to have a smaller diameter in order to produce a greater capillary pressure. As has been described above, the capillary pressure $P_{cap}$ needs to be equal to or higher than the absolute value of the system pressure loss $\Delta P_{total}$. The capillary pressure $P_{cap}$ can be tuned to a desired level by adjusting the diameter of the open-cell foam pore, based on formula (1).

In order to achieve satisfactory cooling performance, the diameter of the open-cell foam pore is preferably 20 [μm] or less, and more preferably 5 [μm] or less. Further, the average diameter of the open-cell foam pore is preferably 3 [μm] or less. With this range of the average diameter, the wick 6 itself can achieve both high capillary pressure and permeability.

When the wick itself is very thin, the wick with the maximum diameter of the open-cell foam pore of 1 [μm] or less, or even 0.1 [μm] or less may function, however, the lower limit of 0.1 [μm] or more is preferable. If the diameter of the open-cell foam pore is too small, the fluid resistance of the wick with respect to the working fluid increases. In this case, the pressure loss in the wick increases, and system pressure will adversely increase.

The diameter of the open-cell foam pore is measured by the bubble point method, and the acquired maximum diameter is used as the maximum diameter of the open-cell foam pore.

In the measurement, a gas pressure is applied to the elastic porous body completely immersed in a test solution, and a pressure at which a gas bubble is observed is determined as the bubble point. Further, using a test solution with a known surface tension, the maximum diameter "d" f the open-cell foam pore is calculated according to formula (8).

$$d = 4T \cos \theta / \Delta P \tag{8}$$

where T is the surface tension of the working fluid, θ is the contact angle between the wick and the working fluid, and ΔP is the pressure loss (bubble point pressure).

The average diameter of the pores can also be determined by the bubble point method. The average diameter of the pores is determined as follows. A pressure (ΔP) is determined from an intersection of the pressure vs. flow rate curve measured with the completely immersed elastic porous body and the half-dry curve, which is half (½) of the pressure vs. flow rate curve measured in the dry state. Then, the average pore diameter is determined using the above-presented formula (8).

(Porosity)

The higher the porosity of the elastic porous body used for the wick 6 is, the more advantageous it is to drive the loop heat pipe 1. Specifically, the porosity of the elastic porous body is preferably 20 [%] or more. With the porosity less than 20 [%], the fluid resistance of the wick with respect to the working fluid increases, and the pressure loss in the wick increases, which makes it difficult to drive the loop heat pipe 1. More preferably, the porosity is 50 [%] or more. The porosity can be calculated by formula (9).

$$\text{Porosity } ([\%]) = 100 \times (SG\text{solid} - SG\text{porous})/SG\text{solid} \quad (9)$$

where SGsolid denotes the specific gravity or the relative density of solid, and SGporous denotes the specific gravity or the relative density of the elastic porous body.

(Elastic Modulus)

The elastic modulus of the wick 6 is measured by a tensile test according to Japan Industrial Standard 7161. The elastic modulus is determined from the slope of the stress-strain curve obtained by the tensile test. Specifically, the elastic modulus E is calculated from formula (10), using the strain value ranging from 0.05% to 0.25%.

$$E = (\sigma_1 - \sigma_2)/(\varepsilon_1 - \varepsilon_2) \quad (10)$$

where $\sigma_1$ is the stress when the strain is 0.25%, $\sigma_2$ is the stress when the strain is 0.05%, $\varepsilon_1$ is the 0.25% strain, and $\varepsilon_2$ is the 0.05% strain.

The material for the wick 6 exhibits a fracture mode close to brittle fracture with respect to tension, and there is concern about slippage between the sample and the chuck. Accordingly, strain in a minute region is adopted. However, with respect to compression, this material is in the elastic deformation region, without undergoing plastic deformation, until the strain increases up to about 25%. The stress σ due to compressive deformation can be calculated from the elastic modulus E determined from formula (10) and the strain ε corresponding to compression rate when the wick is compressed.

It is preferable for the wick 6 to be formed of a material having an elastic region under the compressive strain ε up to 20%. Within this range, the wick 6 can be in close contact with the inner surface of the heat receiver 7 under a predetermined stress, even if the inner dimensions of the heat receiver 7 vary due to fluctuation in the manufacturing process or the temperature change. Further, it is preferable for the wick to have a high elastic modulus as long as it is in the elastic range within the range of compression strain up to 20%. The stress σ [Pa] due to compressive deformation is expressed as σ=ε×E/100 using the compressive strain ε [%] and the elastic modulus E [Pa]. If the compressive strain is the same, the greater the elastic modulus E, the greater the stress σ due to the compressive deformation, and thus high stress can be achieved.

Figure 7:
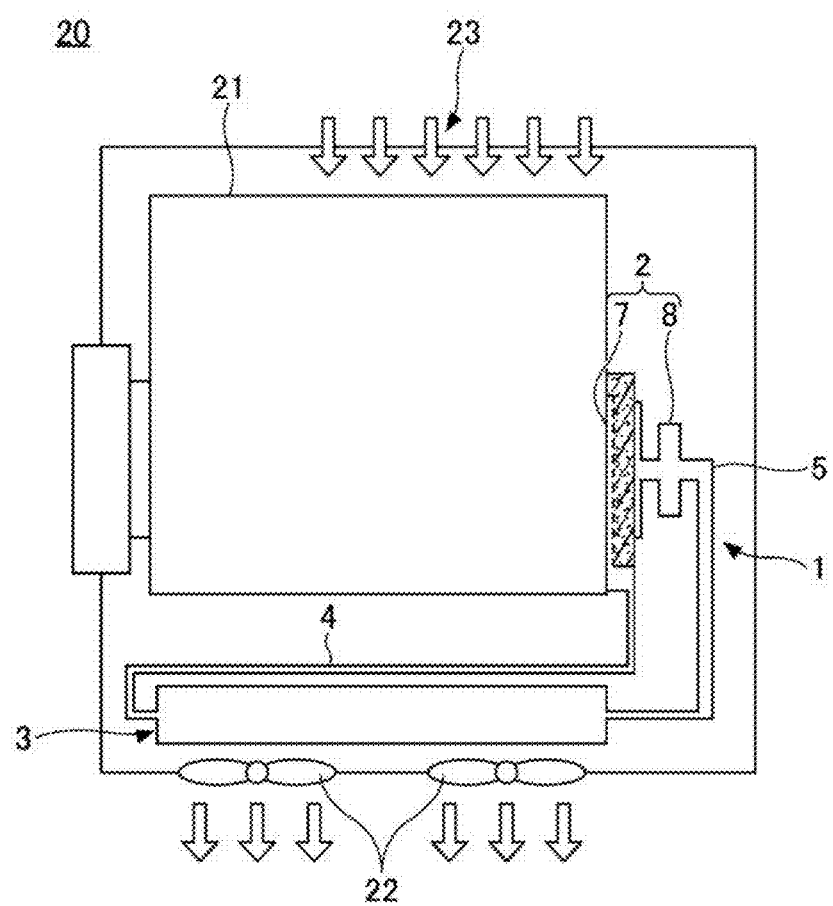
FIG. 7 is a schematic diagram of electronic equipment provided with a loop heat pipe according to an embodiment.

FIG. 7 shows an example of electronic equipment 20 using the above-described wick. The electronic equipment 20 shown in FIG. 7 is a projector having an optical unit 21, which is illustrated as an example of the electronic equipment to which the present embodiment is applied. Examples of the electronic equipment 20 to which the loop heat pipe 1 of the embodiment is applied are not limited to the projector, and include various types of electronic equipment. The electronic equipment may be an imaging apparatus such as a printer, a copy machine, a facsimile machine, and a multifunction apparatus having these functions. Alternatively, the electronic equipment may be a personal computer, a server, an electronic blackboard, a television set, a Blu-ray recorder, a game machine, etc.

In addition, the loop heat pipe 1 and the cooling system according to the embodiment are applicable to a structure other than electronic equipment. For example, the loop heat pipe 1 or the cooling system of the embodiment may be applied to a chemical plant cooling system with a reactor, or a container or a warehouse used to store electronic equipment such as server racks.

As shown in FIG. 1, the evaporator 2 (particularly the heat receiver 7) of the loop heat pipe 1 is provided so as to be in contact with the heat source of the optical unit 21. The evaporator 2 absorbs heat from the heat source to cool the target object (i.e., the heat source, the optical unit, or the projector).

The condenser 3 is provided in the vicinity of the exhaust fan 22 which is provided to the side surface of the housing of the projector's main body. When the exhaust fan 22 vents the air to the outside, an air flow is created around the condenser 3, and the condenser 3 is cooled by the air flow. Consequently, the heat dissipation effect in the condenser 3 is improved.

An air supply port 23 is provided to another side surface of the housing opposite to the exhaust fan 22. The air taken in from the air supply port 23 passes through the projector and is discharged from the exhaust fan 22. In the example shown in FIG. 3, the loop heat pipe 1 and the exhaust fan 22 for enhancing the heat dissipation effect of the loop heat pipe 1 are used in a cooling system for cooling the projector. In place of the exhaust fan 22, a blower fan for blowing the air to the condenser 3 may be used. Further, the cooling system may be configured with only the loop heat pipe 1, without using the fan.

EXAMPLES

Next, explanation is made to a cooling performance test performed on samples, while varying the values of the major parameters of the wick 6 and the loop heat pipe 1, referring to the appended figures as necessary. The samples include examples which have parameter values within the appropriate ranges of predetermined conditions, and comparative examples which have parameter values outside the appropriate range. FIG. 8A and FIG. 8B shows the test result, as well as the measurements of the various factors of the samples used for the cooling performance test.

(Method of Cooling Performance Test)

The cooling performance test is performed on Examples 1 to 3 and Comparative Examples 1 to 5 under the same conditions. The wick used in the test is shaped so as to have a thickness of 2 mm, and is provided inside the heat receiver 7 of the evaporator 2. The internal dimensions of the heat receiver 7 are determined such that a predetermined amount of compression (or the strain) ε [%] is acquired. For example, in order to set ε equal to 20% (ε=20%), the dimension of the heat receiver 7 in the thickness direction of the wick 6 is set to 1.6 mm.

The stress σ [Pa] due to compressive deformation is determined from the relational expression σ=ε×E/100 using the elastic modulus E [Pa] measured in advance by the above method and compression rate (or the strain) ε [%]. Further, the elastically deformable maximum stress $\sigma_{max}$ under the compressive strain is determined from the relation shown in FIG. 4, by measuring compression rate (or the strain) ε [%] and the stress generated at that stress by the compressive deformation of the wick.

Pure water is used as the working fluid for the performance test. Water, as the working fluid, is filled in a vacuumed loop heat pipe.

The system pressure loss is determined by supplying the working fluid through the respective segments of the flow path of the loop heat pipe, and measuring the pressure losses of the respective segments to calculate the total pressure loss.

The flow rate of the working fluid is calculated from the heat quantity processed by the loop heat pipe. The heat quantity processed by the loop heat pipe is set to 100 [W], and the mass flow rate Lm of the working fluid acquired at that heat quantity is calculated based on formula (3). Further, the flow rate Ll [m³/s] of the liquid-phase working fluid and the flow rate Lg [m³/s] of the vapor-phase working fluid are calculated, based on the densities of water vapor and water and formula (4).

The pressure loss of the working liquid caused in each of the components of the flow path is determined as the difference between the pressures at the inlet port and the outlet port of the corresponding flow path segment. The pressure loss is measured under the condition to cause the liquid-phase working fluid (i.e., water) to flow at the flow rate of Ll [m³/s] in the flow path, and to cause the vapor-phase working fluid (i.e., water vapor) to flow at the flow rate of Lg [m³/s]. The positional relationship between the heights of the inlet port and the outlet port of the flow path is the same as the layout of the loop heat pipe in operation. Therefore, the measured pressure loss includes a gravitational pressure drop.

The system pressure loss $\Delta P_{total}$ can be obtained by summing up the pressure losses ($\Delta P_{groove}$, $\Delta P_{VL}$, $\Delta P_{cond}$, $\Delta P_{LL}$, $\Delta P_{res}$, and $\Delta P_{wick}$) measured at the respective components.

Here, the pressure loss of the wick may be determined from the shape or the dimensions of the wick and the physical properties of the working fluid. The pressure loss caused in working fluid flowing through the wick may be calculated by the following formula $$\Delta P_{wick} = \mu \times L \times \Delta x/(k \times S) \quad (11).$$

The parameters used in formula (11) are as follows:
$\Delta P_{wick}$: wick pressure loss due to flow of the working fluid;
μ: viscosity of the working fluid;
L: flow rate of the working fluid;
Δx: thickness of the wick parallel to the flow direction of the working fluid;
S: cross-sectional area of the wick perpendicular to the flow direction of the working fluid; and
k: Permeation rate.

The permeation rate k can be determined from the shape of the porous body based on formula (12), which is the empirical formula of Blake-Kozeny.

$$k = (2 \times rs)^2 \times \varepsilon s^3/(150 \times (1-\varepsilon s))^2 \quad (12)$$

where rs denotes the radius of the open-cell foam pore, and εs is the porosity.

If there is a height difference in the working fluid between the inlet side and the outlet side of the wick (for example, a difference Δx corresponding to the thickness of the wick), the hydraulic head difference according to the height difference is taken into consideration, and the gravitational pressure loss is added to the pressure loss.

The capillary pressure $P_{cap}$ of the wick is determined from the maximum pore diameter of the open-cell foam pore of the wick used in each sample, the contact angle of the working fluid, the surface tension of the water as the working fluid, and formula (1).

The cooling performance test is performed by continuously activating the electronic equipment (projector) 20 for 10 minutes under the condition of electric power of 210 W, and then by measuring the temperature of the heat receiver 7. The electric power of 210 W of the electronic equipment is a condition that the heat quantity processed by the loop heat pipe provided to the heat source (e.g., the light source or the optical unit 21) is 100 W. If the temperature of the heat receiver 7 of the evaporator measured after the continuous 10-minute operation is at or below the operable upper-limit temperature of the light source, the cooling performance is evaluated as being good, marked with a circle. If the measured temperature exceeds the operable upper-limit temperature of the light source, the cooling performance is evaluated as being poor, marked with a cross.

Next, the contact state between the wick 6 and the inner surface of the heat receiver 7 is evaluated. The contact state is evaluated by observing the gap between the wick and the inner surface of the heat receiver 7 by X-ray computed tomography (CT). If gaps are not observed, the contact state is evaluated as being good, marked with a circle. If a gap is observed, the contact state is evaluated as being poor, marked with a cross.

Further, the heat receiver 7 is disassembled after the cooling performance test to check whether the wick 6 or the heat receiver 7 has deformed. If there is no deformation in the wick 6 or the heat receiver 7, the evaluation result is good, and marked with a circle. If deformation is observed, the evaluation result is poor, and marked with a cross.

The conditions of the loop heat pipe and the test results shown in FIG. 8A and FIG. 8B are described below.

Example 1

In Example 1 of the cooling performance test, water-foamed silicone rubber is used as the material of the wick 6. The activator type, the blending amount, and heating condition for synthesizing the silicone rubber are adjusted so that the porosity of the silicone rubber is 70% and that the maximum diameter of the open-cell foam pore (which is referred to simply as "open-cell pore" in the Table of FIG. 8A) is 5 μm. The silicone rubber prepared by this conditions is called "silicone rubber formulation A."

The cross section of the fabricated wick is observed with an electron microscope to confirm that the wick is made of a porous body. FIG. 6 is an image of the cross section of the wick made of the silicone rubber formulation A, observed with a scanning electron microscope. It is clearly shown that the plurality of pores are connected to each other to form open-cell foam pores. It is also understood that the diameter of the open-cell foam pore is 5 μm or less.

A loop heat pipe is assembled using the obtained wick with a strain (or compression rate) ε of 15%, and the cooling performance test is performed to evaluate the cooling performance, the above-described contact state, and the deformation after activation. All the evaluation results are good, marked with circles.

The stress due to the compressive deformation (which is referred to as "compressive deformation stress" in the Table of FIG. 8A) and capillary pressure of Example 1 are greater than the system pressure loss. Further, the contact state between the wick and the inner surface of the heat receiver is good, and the wick is not deformed even after the activation. With these evaluation results of Example 1, it is considered that the satisfactory cooling performance is maintained, while preventing backflow of the vapor-phase working fluid.

Example 2

The wick used in Example 2 is prepared using the same base material as the wick used in Example 1. However, the activator type, the blending amount, and the heating condition for synthesizing the silicone rubber are changed so that the maximum diameter of the open-cell foam pore is 20 μm. The silicone rubber prepared by the modified conditions is called "silicone rubber formulation B." Because the silicone rubber formulation B uses the same base material as the silicone rubber formulation A, and because it has the same porosity as silicone rubber formulation A, the elastic modulus of the wick of Example 2 is the same as the elastic modulus of the silicone rubber formulation A.

A loop heat pipe is assembled using the obtained wick with a strain (or compression rate) of 15%, and the cooling performance test is performed to evaluate the cooling performance, the above-described contact state, and the deformation after activation. All the evaluation results are good, marked with circles.

The stress due to the compressive deformation and capillary pressure of Example 2 are greater than the system pressure loss. Further, the contact state between the wick and the inner surface of the heat receiver is good, and the wick is not deformed even after the activation. With these evaluation results of Example 2, it is considered that the satisfactory cooling performance is maintained, while preventing backflow of the vapor-phase working fluid.

With Example 2, the system pressure loss is smaller than that of Example 1. It is considered that this is because the diameter of the open-cell foam pore is greater than that of Example 1, and because the fluid resistance of the wick is reduced. By configuring the loop heat pipe so as to have lower system pressure loss in this way, the load on the respective components, particularly on the wick, due to the pressure can be reduced. Consequently, the durability of the loop heat pipe and the long-term stability of operation can be further improved.

The capillary pressure of Example 2 is slightly smaller than the stress due to the compressive deformation of the wick. With this configuration, if the heat quantity processed by the loop heat pipe becomes excessive due to a malfunction of the electronic equipment 20, backflow occurs in the wick before the wick itself is damaged or failure due to the excessive deformation, thereby releasing the excessive pressure applied onto the wick. When the electronic equipment 20 returns to the normal operation by means of a safety device or the like, and when the heat quantity to be processed by the loop heat pipe becomes appropriate, then the pressure applied to the wick becomes smaller than the capillary pressure. In this case, the backflow stops and the loop heat pipe returns to the normal operation. Hence, unrecoverable damage due to excessive deformation of the wick can be prevented, and the operational reliability of the loop heat pipe can be improved.

Example 3

The wick used in Example 3 is prepared with the same silicone rubber formulation A as that in Example 1. A loop heat pipe is assembled using the obtained wick with a strain (or compression rate) ε of 20%, which is different from that of Example 1. The cooling performance test is performed to evaluate the cooling performance, the above-described contact state, and the deformation after activation, in the same manner as that of Example 1. All the evaluation results are good, marked with circles.

The stress due to the compressive deformation and capillary pressure of Example 3 are greater than the system pressure loss. Further, the contact state between the wick and the inner surface of the heat receiver is good, and the wick is not deformed even after the activation. With these evaluation results of Example 3, it is considered that the satisfactory cooling performance is maintained, while preventing backflow of the vapor-phase working fluid.

In the loop heat pipe of Example 3, although the stress due to the compressive deformation of the wick is higher than that of Example 1, it is less than the elastically deformable maximum stress of the wick. Accordingly, good cooling performance is achieved, while preventing plastic deformation.

Comparative Example 1

Figure 9:
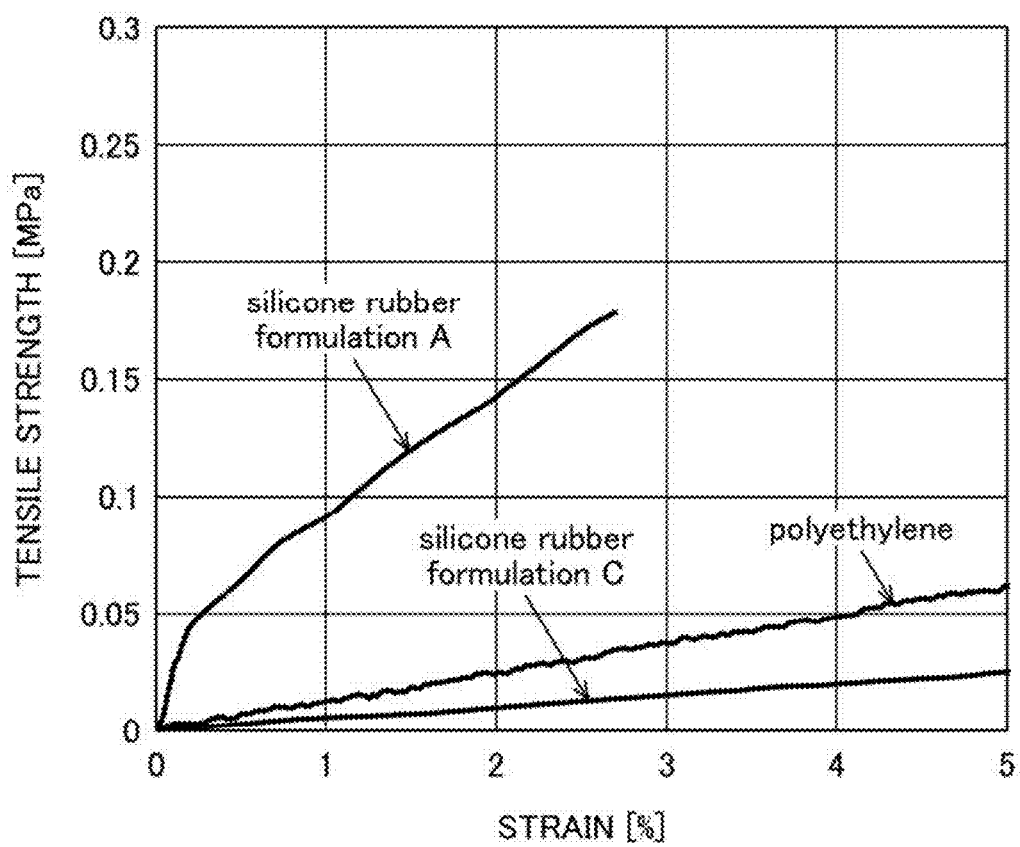
FIG. 9 is a diagram showing an evaluation result of tensile stress of the wick of Example 1.

The wick used in Comparative Example 1 is prepared with silicone rubber formulation C with which the wick material is adjusted so as to reduce the elastic modulus. Silicone rubber formulation C is prepared by adjusting the base material of the silicone rubber formulation A by changing the blending amount of the silica filler and the cross-linking density. The porosity and the maximum diameter of the open-cell foam pore of Example 3 are at the same levels as those of the silicone rubber formulation A of Example 1, which is achieved by adjusting the activator type, the blending amount, and the heating condition. FIG. 9 shows the measurement result of the stress with respect to the strain of the wick of Comparative Example 1, together with the measurement results of a sample using silicone rubber formulation A and a sample using polyethylene. The slope of strain-stress line of the silicone rubber formulation C is smaller than that of silicone rubber formulation A in FIG. 9. It is understood that the elastic modulus of the silicone rubber formulation C is smaller than that of silicone rubber formulation A. The bulk modulus of the silicone rubber formulation C is 5000 [Pa], which is less than those of the silicone rubber formulations A and B.

The wick of Comparative Example 1 is provided in the heat receiver 7 of the evaporator 2 with the strain (or compression rate) ε of 15%, which is the same as the strain of Example 1. Then the cooling performance test is performed to evaluate the cooling performance, the contact state, and the deformation after activation of the predetermined time. The cooling performance is evaluated as being poor, marked with a cross, and the performance is unsatisfactory. This may be because the bulk modulus of the wick in Comparative Example 1 is low, and because the stress due to compressive deformation is smaller than those of Examples 1 to 3 and even smaller than the system pressure loss. For these reasons, satisfactory performance cannot be achieved even if the compression rate is set to 15%. It is also considered that the wick 6 has deformed in an undesirable way because the system pressure loss, which corresponds to the pressure difference at the boundary between the liquid phase and the vapor phase of the wick 6, is greater than the stress due to the compressive deformation of the wick. As a result, a gap is created between the wick and the inner surface of the heat receiver, and flowback of the vapor-phase working fluid is caused in the wick. Due to the backflow of the vapor-phase working fluid, the heat quantity processable in the loop heat pipe has decreased, and the temperature of the heat receivers has increased.

Comparative Examples 2 and 3

In Comparative Examples 2 and 3, the compression rate of the wick is set to 5% and 30%, respectively, using the wicks of the silicone rubber formulation A prepared by the same process as in Example 1. The cooling performance test is performed in the same manner as Example 1 to evaluate the same factors. The cooling performances in Comparative Example 2 and Comparative Example 3 are both poor, marked with cross marks.

The contact state of the wick in the loop heat pipe of Comparative Example 2 is poor, marked with a cross, because a gap is observed between the wick and the inner surface of the heat receiver. This is because the compression rate is only 5%, and because the stress due to compressive deformation of the wick is smaller than that in Example 1. It may be considered that the dimensional variation in the thickness of the wick or the variation in the inner dimensions of the heat receiver cannot be absorbed by the elastic deformation of the wick, and therefore the gap is left. It may also be considered that because the vapor-phase working fluid flows backward through the gap between the wick and the inner surface of the heat receiver, satisfactory cooling performance cannot be achieved.

In Comparative Example 3, the deformation after activation of the loop heat pipe is poor, marked with a cross, because the wick itself has plastically deformed. For this reason, the compressive deformation stress of Comparative Example 2 shown in FIG. 8A has no data. The plastic deformation may be due to the compression rate of the wick using the silicone rubber formulation A set to 30%, which exceeds the elastically deformable maximum stress of 25%. Therefore, even if the contact state is evaluated as being good, marked with a circle, the compressive deformation stress of the wick is insufficient. It is considered that the wick has undesirably deformed under the pressure of the vapor-phase working fluid, which causes backflow of the vapor-phase working fluid, and therefore, satisfactory cooling performance cannot be achieved. In addition, dimensional change in the wick and the heat receiver due to the temperature change during the operation cannot be absorbed by the elastic deformation, and a gap created between the wick and the inner surface of the heat receiver causes backflow of the vapor-phase working fluid, resulting in the poor cooling performance.

Comparative Example 4

Comparative Example 4 uses polyethylene for the base material of the wick. The porosity, the maximum diameter of the open-cell foam pore, and the contact angle of the fabricated wick are all in the suitable range. Similar to Example 1, the fabricated wick is provided in the heat receiver of the evaporator in a compressed and deformed state with a compression rate of 15%. The cooling performance test is performed to evaluate the cooling performance, the contact state, and deformation after activation. The cooling performance is evaluated as being poor, marked with a cross.

The stress due to compressive deformation in Comparative Example 4 is smaller than the system pressure loss. This is because polyethylene, which is the base material of the wick, has a low bulk modulus. For this reason, a sufficient amount of stress due to compressive deformation cannot be obtained even at the compression rate of 15%. It may be considered that the contact state between the wick and the inner surface of the heat receiver is deteriorated due to the pressure of the vapor-phase working fluid, causing backflow and leakage of the vapor-phase working fluid, and considered that the cooling performance is lowered.

Comparative Example 5

In Comparative Example 5, a sintered metal obtained by sintering and molding metal particles is used as the material of the wick. Such a sintered metal is a porous material through which the liquid-phase working fluid can permeate, and is conventionally used for a loop heat pipe. The wick made of a sintered metal is provided in the heat receiver of the evaporator in a compressed and deformed state with a compression rate of 5%, and the cooling performance, the contact state, and deformation after activation are evaluated in the same manner as in Example 1. All evaluation results are poor, marked with crosses.

As to the contact state of Comparative Example 5, a gap is observed between the wick and the inner surface of the heat receiver. The cooling performance is deteriorated because of backflow of the vapor-phase working fluid flows through the gap toward the reservoir side. It may be considered that the elastic deformation range of the metal sintered body is narrow, and the wick is incapable of absorbing the variations in the flatness or the dimensions of the inner surface of the heat receiver by means of the elastic deformation.

As to the deformation of Comparative Example 5, the heat receiver of the evaporator itself has deformed. The metal-sintered wick is provided in the heat receiver at the compression rate of 5% in order to improve the contact between the wick and the inner surface of the heat receiver. However, the rigidity of the wick is too high, and therefore, it may be considered that the case of the heat receiver has deformed when the wick is assembled into the evaporator. Due to the deformation of the case, the gap is created between the wick and the inner surface of the heat receiver, and the vapor-phase working fluid flows through the gap back to the reservoir side, resulting in the deterioration of the cooling performance.

In order to assemble a loop heat pipe using the wick of Comparative Example 5, both the dimensional accuracy of the wick such as flatness or the thickness variation and the dimensional accuracy of the heat receiver such as the flatness of the inner surface have to be greatly improved. Such improvement in manufacturing accuracy will increase the manufacturing cost of the loop heat pipe, and is undesirable.

From the results of the cooling performance test using the samples of Examples 1 to 3 and Comparative Examples 1 to 5, the following effects have been confirmed as to the stress due to compressive deformation of the wick 6 and the system pressure loss of the loop heat pipe of the present embodiment.

(Structures of Examples 1 to 3)

Examples 1 to 3 have a configuration (i.e., the first configuration), in which the stress due to the compressive deformation of the wick is greater than the system pressure loss. With the first configuration, the wick 6 comes into close contact with the inner surface of the heat receiver 7, and undesirable backflow of the working fluid can be prevented. As a result, the cooling performance can be maintained in a stable manner.

Examples 1 to 3 have a configuration (i.e., the second configuration), in which the stress due to the compressive deformation of the wick is less than the elastically deformable maximum stress of the wick. With the second configuration, the wick 6 is stably in contact with the inner surface of the heat receiver 7, maintaining the thermal contact, and backflow of the working fluid can be prevented, even if the dimensions of the wick or the heat receiver vary due to the temperature change. As a result, the cooling performance can be maintained in a stable manner. Further, the thermal contact between the wick 6 and the inner surface of the heat receiver 7 is improved, and the cooling efficiency can be improved.

Examples 1 to 3 have a configuration (i.e., the third configuration), in which the capillary pressure of the working fluid in the wick is greater than the system pressure loss. With the third configuration, backflow of the vapor-phase working fluid can be prevented at the boundary 62 between of the vapor phase and the liquid phase, formed in the wick 6, whereby the cooling performance can be maintained in a stable manner in the above-described cooling performance test.

Comparative Examples 1, 2, and 4 are different from the first configuration in that the stress due to the compressive deformation of the wick is less than the system pressure loss. Comparative Examples 3 and 4 are different from the second configuration in that a stress equal to or higher than the elastically deformable maximum stress is applied to the wick, which causes plastic deformation of the wick.

From these comparisons, it is found that the cooling performance can be stably maintained by setting the compressive deformation stress of the wick to be greater than the system pressure loss, and less than the elastically deformable maximum stress of the wick.

Examples 1 to 3 have a configuration (i.e., the fourth configuration), in which the wick 6 is made of foamed silicone rubber. Because the wick 6 has an elastic porous body made of a foamed silicone rubber, the wick 6 can be maintained in close contact with the inner surface of the heat receiver 7 under an appropriate stress. Further, by forming the wick with the foamed silicone rubber, heat resistance can be imparted.

In contrast, the wick of Comparative Example 5 is formed of sintered metal (aluminum), which is different from the fourth configuration. Although the wick of Comparative Example 5 has heat resistance, the elasticity is insufficient and close contact with the inner surface of the heat receiver cannot be achieved. In order to bring the wick of Comparative Example 5 to be in close contact with the inner surface of the heat receiver, a highly precise processing or machining technique is required to manufacture the wick and the heat receiver with a flat inner surface.

The elastically deformable maximum stress of the wick of Example 2 is greater than the capillary pressure of the working fluid through the wick (i.e., the fifth configuration). With the fifth configuration, even if an excessive amount of heat is applied to the loop heat pipe and a pressure higher than expected is produced, unrecoverable damage such as plastic deformation of the wick can be prevented. Hence, the reliability of the loop heat pipe can be improved.

Although the preferred embodiments have been described above with reference to the appended drawings, the configuration of the loop heat pipe 1 is not limited to the above-described examples illustratively presented, and there are many substitutions and alterations without departing from the gist.

For example, the loop heat pipe 1 of the present embodiment is not limited to the structure having one evaporator 2 and one condenser 3 as illustrated in FIG. 1 and FIG. 2, and two or more evaporators 2 or condensers 3 may be provided to the loop heat pipe 1.

Although, in the loop heat pipe 1 of the embodiment described with reference to FIG. 1 and FIG. 2, only one wick 6 is provided inside the evaporator 2, two or more wicks may be provided in parallel in the evaporator 2. The grooves of FIG. 1 and FIG. 2 are not necessarily formed in the wick 6, and instead, the grooves may be formed inner surface of the case of heat receiver case. The heat receiver 7 of the evaporator 2 and the wick 6 of FIG. 1 and FIG. 2 do not necessarily have flat plate shapes, and they may have cylindrical shapes or wedge shapes.

The configurations explained above are only illustrative examples, and each of the following aspects provides a peculiar effect.

(Aspect 1)

In a loop heat pipe having an evaporator that changes a phase of a working fluid from a liquid phase to a vapor phase; a condenser that changes the phase of the working fluid from the vapor phase to the liquid phase; a vapor line connected between the evaporator and the condenser through which the vapor-phase working fluid flows; a liquid line connected between the condenser and the evaporator through which the liquid-phase working fluid flows; and a wick having an elasticity and provided inside the evaporator in a compressed and deformed state, the liquid-phase working fluid permeating into the wick and forming a boundary between the liquid phase working fluid and the vapor phase working fluid in the wick. A stress generated in the wick due to compressive deformation is greater than a pressure loss that occurs during circulation of the working fluid from the vapor-phase side of the boundary via the condenser back to the liquid-phase side of the boundary.

According to this configuration, the stress due to the compressive deformation of the wick is greater than the pressure loss caused during the circulation of the working fluid, and accordingly, the contact between the wick and the inner surface of the evaporator is stably maintained, as has been explained in connection with the cooling performance test described above. Further, the thermal contact between the wick and the inner surface of the heat receiver is improved, and the cooling efficiency is improved.

(Aspect 2)

In aspect 2 based on the aspect 1, the stress due to the compressive deformation of the wick is set to be smaller than the elastically deformable maximum stress of the wick. With this configuration, the wick can be provided inside the evaporator at a compression rate within the elastic region. Even if the dimensions of the wick or the evaporator vary due to temperature change, the close contact between the wick and the inner surface of the evaporator can be maintained by the elastic deformation of the wick.

(Aspect 3)

In aspect 3 based on the aspect 1 or 2, the elastic wick is made a porous body, and the capillary pressure of the liquid-phase working fluid through the elastic wick is set to be greater than the pressure loss.

With this configuration, the pressure at the boundary between the liquid phase and the vapor phase in the wick is higher than the pressure of the vapor-phase working fluid, and accordingly, backflow of the vapor-phase working fluid can be prevented from occurring inside the wick.

(Aspect 4)

In aspect 4 based on the aspect 3, the stress due to the compressive deformation of the elastic wick is set to be greater than the capillary pressure of the liquid-phase working fluid through the wick.

With this configuration, the vapor-phase working fluid flows backward through the wick before the wick has deformed due to the pressure rise of the vapor-phase working fluid, and unrecoverable damage caused by the deformation of the wick can be prevented, as described in the embodiments.

(Aspect 5)

In aspect 5 based on any one of the aspects 1 to 4, the elastic wick is made of a foam rubber.

With this configuration, the contact between the wick and the inner surface of the evaporator can be improved by the elastic deformation of the wick, as has been described in the embodiments.

(Aspect 6)

In aspect 6 based on the aspect 5, the foam rubber is water-foamed silicone rubber.

With this configuration, the operating temperature range can be widened owing to the high heat resistance, as has been described in the embodiments.

(Aspect 7)

In aspect 7, the loop heat pipe according to any one of the aspects 1 to 6 is used for a cooling system.

By applying the loop heat pipe to the cooling system, is, good cooling performance can be achieved.

(Aspect 8)

In aspect 8 based on the aspect 7, the cooling system is applied to electronic equipment such as a projector.

According to this application, the heat source of the electronic equipment can be effectively cooled.

(Aspect 9)

A wick used for a loop heat pipe is provided. The wick is formed of an elastic porous body that is elastically deformable due to stress and allows a working fluid to permeate inside. The elastically deformable maximum stress of the elastic porous body under compressive deformation is set to be greater than the capillary pressure of the working fluid permeating into the elastic porous body. With this structure, damage due to unrecoverable deformation of the wick can be prevented when the wick is applied to a loop heat pipe, as has been described in the embodiments. Consequently, the reliability of the loop heat pipe can be improved.

(Aspect 10)

In aspect 10 based on the aspect 9, the elastic porous body is made of a foam rubber. With this configuration, in the application to the loop heat pipe, the contacting state between the wick and the inner surface of the evaporator can be improved.

(Aspect 11)

In aspect 11 based on the aspect 10, the foam rubber is a water-foamed silicone rubber. According to this, the heat resistance and chemical resistance of the wick can be improved.

What is claimed is:

1. A loop heat pipe comprising:
   an evaporator that changes a phase of a working fluid from a liquid phase to a vapor phase;
   a condenser that changes the phase of the working fluid from the vapor phase to the liquid phase;
   a vapor line connected between the evaporator and the condenser, through which the vapor-phase working fluid flows;
   a liquid line connected between the condenser and the evaporator, through which the liquid-phase working fluid flows; and
   a wick including an elastic porous body having an elasticity and provided inside the evaporator in a compressed and deformed state, the liquid-phase working fluid permeating into the wick and forming a boundary between the liquid phase working fluid and the vapor phase working fluid in the wick,
   wherein:
   a stress generated in the wick due to compressive deformation is greater than a pressure loss that occurs during circulation of the working fluid from a vapor-phase side of the boundary via the condenser back to a liquid-phase side of the boundary,
   the elastic porous body is under stress due to compressive deformation of the wick such that the stress on the elastic porous body is less than a maximum stress omax at which the wick can be elastically deformed,
   the wick is compressed in a thickness direction of a heat receiver of the loop heat pipe,
   the wick is compressed and stored with a compressive strain ε of 20% or less,
   the elastic porous body includes a water-foamed silicon rubber, and
   a thickness of the wick in an uncompressed state is 2 mm.

2. The loop heat pipe as claimed in claim 1, wherein the stress due to the compressive deformation of the wick is set to be smaller than an elastically deformable maximum stress of the wick.

3. The loop heat pipe as claimed in claim 1, wherein the wick is formed of a porous body, and a capillary pressure of the liquid-phase working fluid through the wick is set to be greater than the pressure loss.

4. The loop heat pipe as claimed in claim 3, wherein the stress due to the compressive deformation of the wick is set to be greater than the capillary pressure of the liquid-phase working fluid through the wick.

5. A cooling system comprising:
   a loop heat pipe comprising an evaporator that changes a phase of a working fluid from a liquid phase to a vapor phase; a condenser that changes the phase of the working fluid from the vapor phase to the liquid phase; a vapor line connected between the evaporator and the condenser through which a vapor-phase working fluid flows; a liquid line connected between the condenser and the evaporator through which a liquid-phase working fluid flows; and a wick including an elastic porous body having an elasticity and provided inside the evaporator in a compressed and deformed state;
   a heat receiver configured to receive heat from outside and transfer the heat to the evaporator; and
   a heat sink configured to release the heat from the condenser to the outside,
   wherein:
   the liquid-phase working fluid permeates through the wick and forms a boundary between the liquid phase working fluid and the vapor phase working fluid, and wherein a stress generated in the wick due to compressive deformation is greater than a pressure loss that occurs during circulation of the working fluid from a vapor-phase side of the boundary via the condenser back to a liquid-phase side of the boundary in the wick, the elastic porous body is under the stress due to the compressive deformation of the wick such that the stress on the elastic porous body is less than a maximum stress σmax at which the wick can be elastically deformed, the wick is compressed in a thickness direction of the heat receiver, the wick is compressed and stored with a compressive strain ε of up to 20% or less, the elastic porous body includes a water-foamed silicon rubber, and a thickness of the wick in an uncompressed state is 2 mm.

6. Electronic equipment comprising:

the cooling system as claimed in claim 5; and a heat source that is in thermal contact with the heat receiver.

7. A wick used for a loop heat pipe, the wick comprising:

an elastic porous body that allows a working fluid to permeate inside, wherein an elastically deformable maximum stress of the elastic porous body under compressive deformation is set to be greater than a capillary pressure of the working fluid permeating into the elastic porous body, and set to be less than a maximum stress σmax at which the elastic porous body can be elastically deformed, and wherein;

the wick is compressed in a thickness direction of a heat receiver of the loop heat pipe, the wick is compressed and stored with a compressive strain ε of 20% or less, the elastic porous body includes a water-foamed silicon rubber, a thickness of the wick in an uncompressed state is 2 mm.

8. The wick as claimed in claim 7, wherein:

the foam rubber is formed by cutting a cross section of the water-foamed silicone rubber which includes bubbles, and the bubbles, which are spherical voids, are in a range of 0.1 μm to 50 μm in size, and the foam rubber is stirred so that a majority of the bubbles are 5 μm to 20 μm in size.

9. The wick as claimed in claim 7, wherein:

pores of the elastic porous body are 50 μm or less.

10. The wick as claimed in claim 7, wherein:

the elastic porous body includes open-cell foam pores having a diameter of 20 μm or less.

11. The wick as claimed in claim 10, wherein:

the open-cell foam pores have a diameter of 3 μm or less.

12. The wick as claimed in claim 10, wherein:

a lower limit of a maximum diameter of the open-cell foam pores is 0.1 μm or more.

13. The wick as claimed in claim 10, wherein:

the diameter of the open-cell foam pores is measured by a bubble point method, and a maximum diameter of the open-cell foam pores is a maximum interconnecting hole diameter of the wick.

\* \* \* \* \*